United States Patent [19]

Lau

[11] Patent Number: 4,514,695
[45] Date of Patent: Apr. 30, 1985

[54] POCKET BATTERY TESTER

[76] Inventor: Chester P. K. Lau, 1550 Wilder Ave., Apartment - 805-A, Honolulu, Hi. 96822

[21] Appl. No.: 414,553

[22] Filed: Sep. 3, 1982

[51] Int. Cl.³ .............................................. G01N 27/46
[52] U.S. Cl. ...................................... 324/437; 340/636
[58] Field of Search ............... 324/72.5, 158 F, 158 P, 324/426, 435, 437, 115, 156, 73 R; 340/636

[56] References Cited

U.S. PATENT DOCUMENTS

| 1,144,255 | 6/1915 | Schade | 324/426 |
| 2,602,096 | 7/1952 | Gilbert | 324/435 |
| 2,693,576 | 11/1954 | Koppelmann | 324/119 |
| 2,708,735 | 5/1955 | Sparr | 324/437 |
| 3,493,863 | 2/1970 | Girwood | 324/145 |
| 3,736,498 | 5/1973 | Skutch, Jr. | 324/437 |
| 3,753,095 | 8/1973 | Nichols | 324/437 |
| 4,151,462 | 4/1979 | Teyler | 324/72.5 |

OTHER PUBLICATIONS

Radio Shack 1980 Catalogue, Tandy Corporation, 1979, p. 139.

Primary Examiner—Michael J. Tokar
Assistant Examiner—Kevin D. O'Shea
Attorney, Agent, or Firm—William H. Wright

[57] ABSTRACT

This invention relates to battery testing devices in general, and more specifically to a compact battery testing device having multiple, extensible, and articulated contact points, which allow virtually every type of portable appliance battery to be tested to determine if the batteries need to be replaced.

2 Claims, 7 Drawing Figures

POCKET BATTERY TESTER

BACKGROUND OF THE INVENTION

Recent technological advancements have spawned a tremendous amount of portable or hand held appliances, such as cameras, calculators, watches, tape recorders, etc, which require various types and sizes of batteries, in order to operate.

While the prior art has developed compact portable battery testers, as can be seen by reference to U.S. Pat. Nos. 3,493,863; 3,736,498; 3,753,095 and 2,708,735, which include articulated and variable size battery testers; these devices are limited in their versatility, and their ability to test not only different sized batteries, but also the different types of battery such as the button, barrel, and post batteries.

Give these limitations, the present situation requires that a number of different portable battery testers would have to be purchased by the consumer, in order to test all of the different types of batteries now commercially available.

It was precisely because of this situation that the present invention was developed, and as will be seen further on in the specification, the end result of this development produced a very versatile and unique construction, which obviates all of the inherent problems found in other prior art devices.

SUMMARY OF THE INVENTION

An object of the present invention is to provide a small, compact, versatile, portable battery tester.

Another object of the present invention is to provide a battery tester that can test various sized batteries.

A further object of the present invention is to provide a battery tester that can test various types of batteries.

A still further object of the present invention is to provide a battery tester that has multiple, articulated, and extensible contact points to accommodate various batteries.

Yet another object of the present invention is to provide a new and unique battery tester that will avoid all of the problems encountered with prior art devices.

A yet further object of the present invention is the provisions of a battery tester, whose ingenious construction not only occupies very little space while not in use, but also houses extensible and articulated contact elements, which accommodate even large flashlight and heavy duty batteries.

These and other objects advantages and novel features of the invention will become apparent from the detailed description which follows, when considered in conjunction with the accompanying drawings.

DETAIL DESCRIPTION OF THE PREFERRED EMBODIMENT

Figure 1:
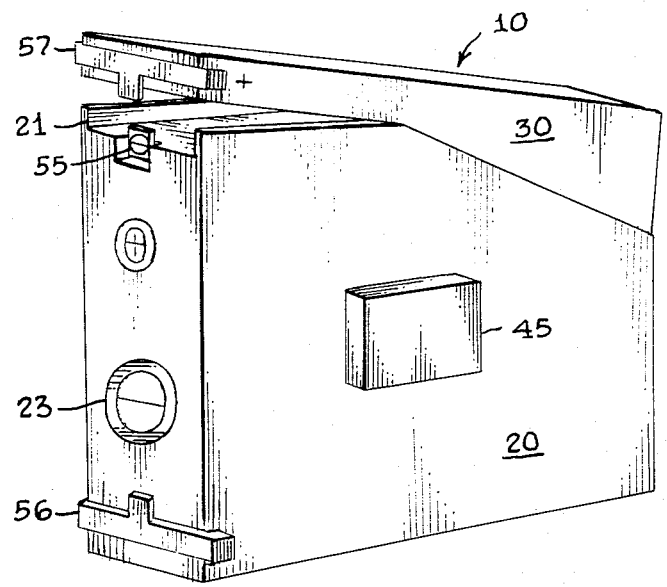
FIG. 1 is a perspective view of the portable battery tester that forms the basis of the present invention.

Referring now to the drawings, wherein like reference numerals designate similar or identical structural features, it can be seen that the portable battery tester, which forms the basis of the present invention, is designated generally as 10.

The pocket battery tester 10, comprises a two-piece housing, which contains the various contact elements 50, and their electrical leads 60, which connect the contact elements to the test circuitry 40, in a well recognized manner.

The housing comprises a generally rectangular bottom casing 20, to which an upper casing 30, is pivotally connect at its rearward end. The bottom casing 20, is provided with a recess 21, which is dimensioned to receive the pivoted upper casing 30, in its stored position. In addition, the bottom casing 20, is further provided with a plurality of apertures 22 and 23, which house contact elements 52 and 53, whose purpose and function will be described in greater detail further on in the specification.

The forward face of the housing 25, is also provided with a recessed contact element 55, proximate its top, and an extensible contact 56, which is slideably, received in a recess 26, disposed proximate its bottom. The pivoted upper casing 30, on the other hand, is only provided with a single extensible contact 57, which is slideably received within a suitably dimensioned recess 36, in its forward face 35.

These extensible contacts 56 and 57, comprise elongated flat strips of metal having their free ends bent towards one another, and whose captive ends are connected to the leads 60, either permanently, or in a sliding contact fashion.

The remaining contact elements, comprise; a pair of cooperating contact elements 52 and 53, which are disposed within the apertures 22 and 23, and dimensioned engage the post and receptacle terminals commonly found on 9-volt batteries.

It is to be understood at this point, that all of the contact elements are connected by leads 60 to one side, or the other, of a coil element 41, which responds to electrical impulses to actuate a needle 42, which register the strength of the current sensed.

Contact elements 52 and 57, are intended to contact the positive side of a battery, and contact elements 53, 55 and 56, are intended to contact the negative side of the battery. Anytime, any positive contact, and any negative contact, engage the respective portions of a battery, the electrical circuit will be closed; and the current produced by the battery will be reflected on the dial 45, disposed on one side of the bottom casing, to indicate the freshness of the battery.

Figure 4:
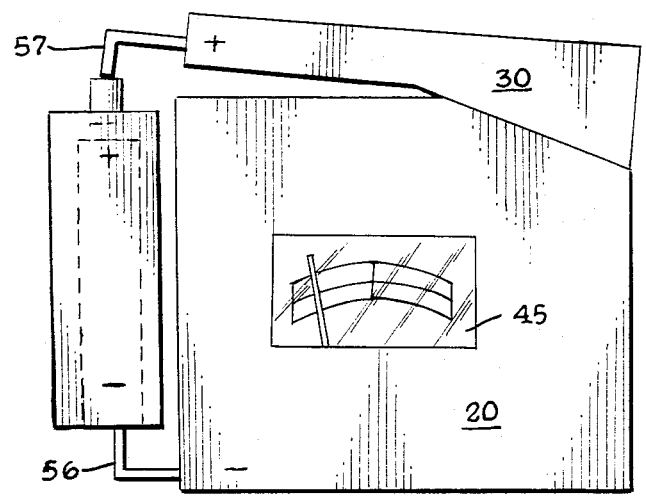
FIG. 4 shows the battery tester being used to test "barrel" type batteries.
Figure 2:
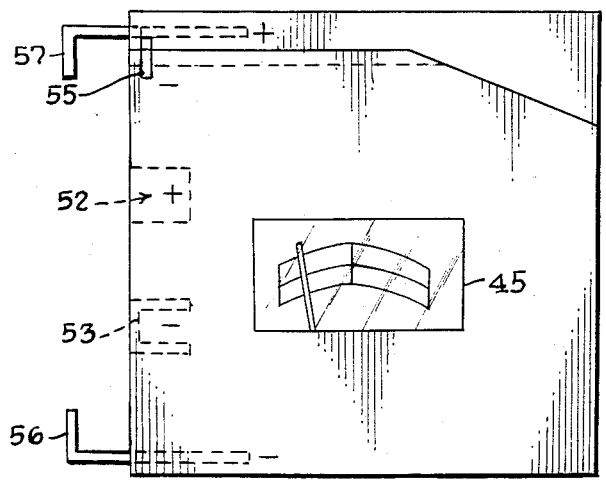
FIG. 2 is a side view of the pocket battery tester.
Figure 7:
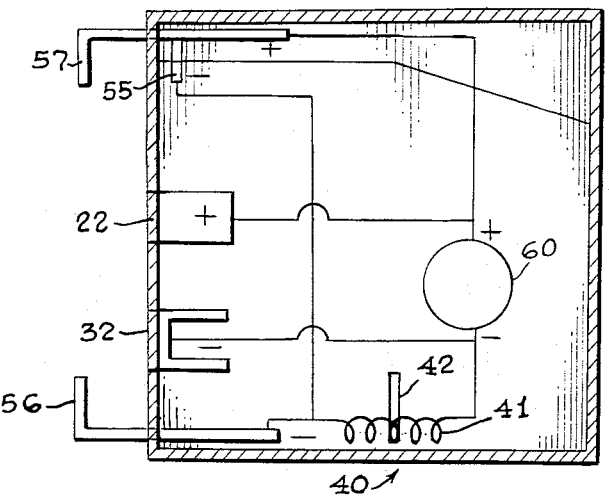
FIG. 7 is a sectional view of the battery tester showing the circuitry employed.
Figure 5:
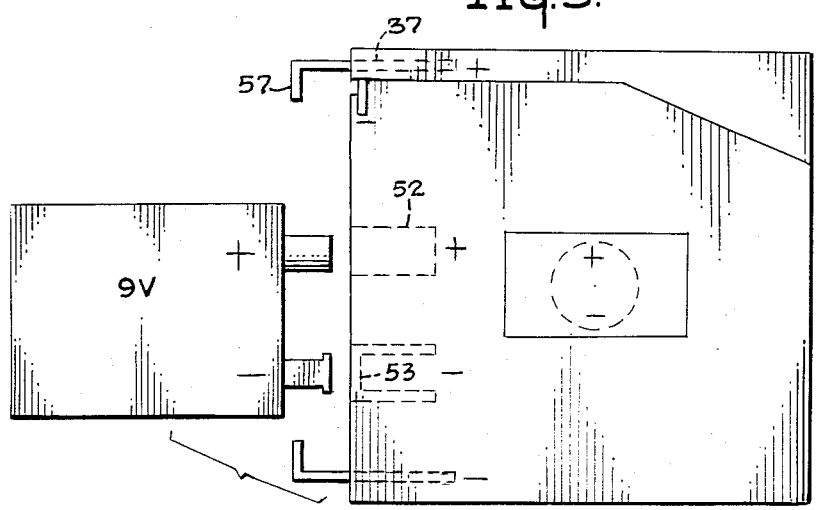
FIG. 5 shows the battery tester being used to test "post and collar" type batteries.
Figure 6:
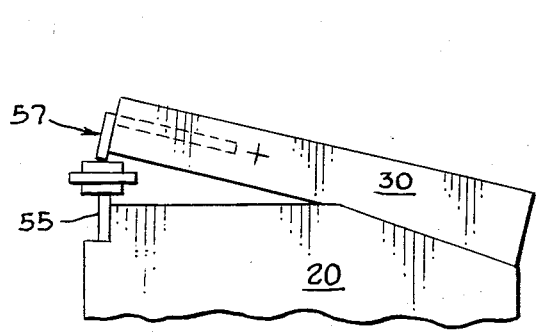
FIG. 6 shows the battery tester being used to test "button" type batteries.
Figure 3:
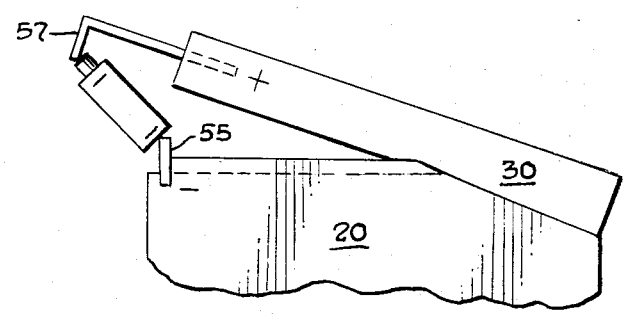
FIG. 3 shows the battery tester being used to test "pencil" type batteries.

As can be seen in FIGS. 2 thru 7, contact elements 56 and 57, are designed to establish a closed circuit with various width and length flashlight and penlight type batteries. Since these contacts are extensible with respect to the housing, and pivoted with respect to one another, a wide range of batteries may be tested with just these two contacts.

Various width button type batteries may be tested by placing them between hinged contact 57 and the recessed contact 55, to produced a closed circuit. As mentioned earlier, contact elements 52 and 53, established a closed circuit by engaging the post and receptacle on 9-volt batteries.

It can be seen therefore, that a battery tester constructed in accordance with the above teachings, can test virtually all types and sizes of batteries, yet can be compact and have a slim profile. This is possible due to the pivoted and extensible cooperation of selected contact elements with respect to other contact elements.

Having thereby described the subject matter of this invention, it should be obvious that many substitutions, modifications, and variations of the invention are possible in light of the above teachings. It is therefore to be understood that the invention as taught and described, is only to be limited to the extend of the breadth and scope of the appended claims.

What I claim is:

1. An improved battery testing device consisting of:
   a two piece housing comprising a upper casing, and a bottom casing, pivotally connected to another, testing circuitry contained within the housing,
   a first and second extensible contact elements, slideably disposed in respective casings, and operatively connected by leads to opposite ends of said testing circuitry; wherein the bottom casing is further provided with a pair of apertures containing third and fourth contact elements, which are dimensioned to engage the post and receptacle terminals of a battery, and are connected by leads to opposite ends of the testing circuitry, and the bottom casing is further provided with a fifth contact element, connected to one of the said opposite sides of said testing circuitry.

2. An improved battery testing apparatus as in claim 1: wherein,
   selective pairs of the said contact elements are adapted to engage the positive and negative terminals of batteries of different types and sizes to form a closed loop testing circuit.

* * * * *